(12) United States Patent
Kramer

(10) Patent No.: US 11,695,399 B2
(45) Date of Patent: Jul. 4, 2023

(54) DIGITAL TIMER DELAY LINE WITH SUB-SAMPLE ACCURACY

(71) Applicant: Dialog Semiconductor (UK) Limited, London (GB)

(72) Inventor: Michael Kramer, Langerringen (DE)

(73) Assignee: Dialog Semiconductor (UK) Limited, London (GB)

( * ) Notice: Subject to any disclaimer, the term of this patent is extended or adjusted under 35 U.S.C. 154(b) by 169 days.

(21) Appl. No.: 17/380,247

(22) Filed: Jul. 20, 2021

(65) Prior Publication Data

US 2022/0038084 A1 Feb. 3, 2022

(30) Foreign Application Priority Data

Jul. 30, 2020 (DE) .......................... 102020209640.6

(51) Int. Cl.
*H03K 5/135* (2006.01)
*H03K 5/131* (2014.01)
*H03K 5/00* (2006.01)

(52) U.S. Cl.
CPC ............. *H03K 5/135* (2013.01); *H03K 5/131* (2013.01); *H03K 2005/00247* (2013.01)

(58) Field of Classification Search
CPC ................... H03K 5/135; H03K 5/131; H03K 2005/00247; G01D 5/2448; H04L 7/04
See application file for complete search history.

(56) References Cited

U.S. PATENT DOCUMENTS

| | | | | |
|---|---|---|---|---|
| 4,719,375 A | * | 1/1988 | Martin | H03K 5/135 327/261 |
| 2004/0189372 A1 | * | 9/2004 | Millar | H03K 5/135 327/341 |
| 2005/0184777 A1 | * | 8/2005 | Stoops | H03K 5/04 327/172 |
| 2014/0126677 A1 | * | 5/2014 | Fritsch | G01D 21/02 375/362 |
| 2017/0223646 A1 | * | 8/2017 | Romera | H04L 7/02 |
| 2021/0126643 A1 | * | 4/2021 | Tripodi | H03K 7/08 |

* cited by examiner

*Primary Examiner* — Khanh C Tran
(74) *Attorney, Agent, or Firm* — Saile Ackerman LLC; Stephen B. Ackerman

(57) ABSTRACT

The present document relates to a timer which is counter-based and uses an asynchronous circuitry to improve the accuracy between the available clock cycles. In particular, a timer is presented which may comprise a first timer circuit configured to receive a clock signal and a trigger signal, wherein an edge of the trigger signal arrives after a first edge of the clock signal and before a second edge of the clock signal. The first timer circuit may be configured to determine, in a capture phase, a time offset interval for approximating a time interval between the first edge of the clock signal and the edge of the trigger signal.

24 Claims, 10 Drawing Sheets

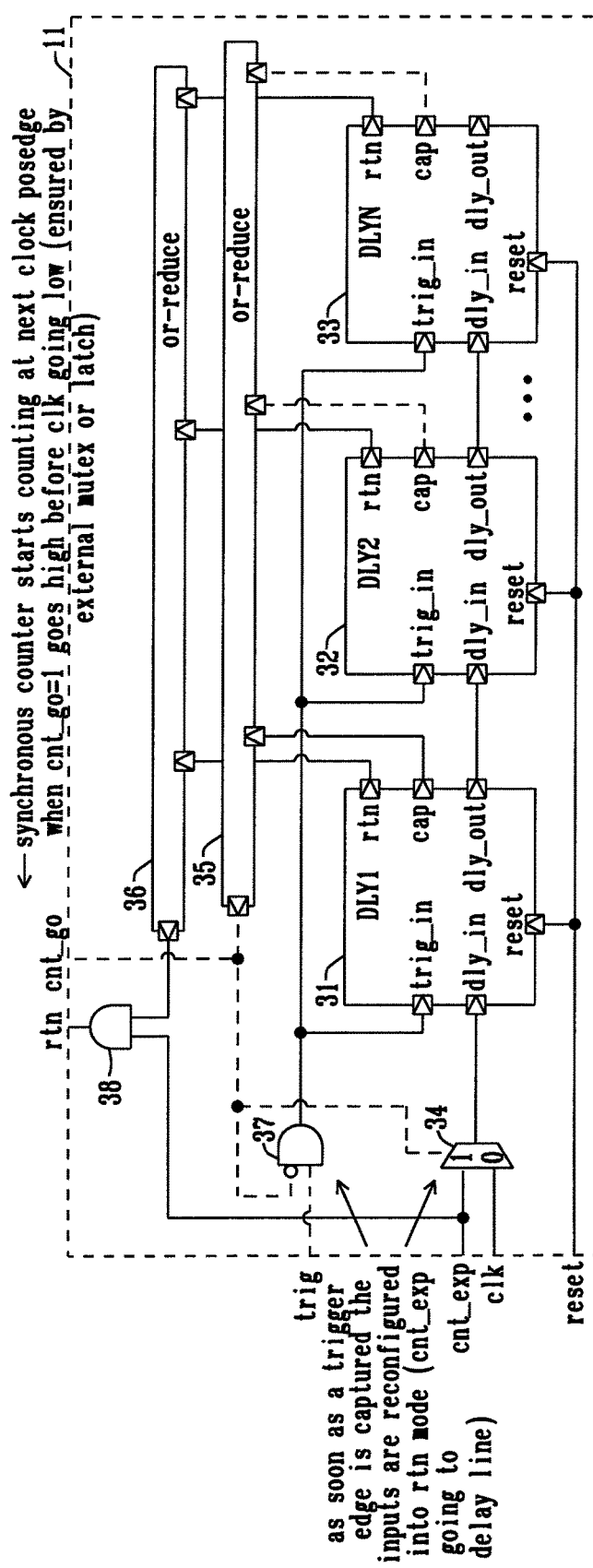
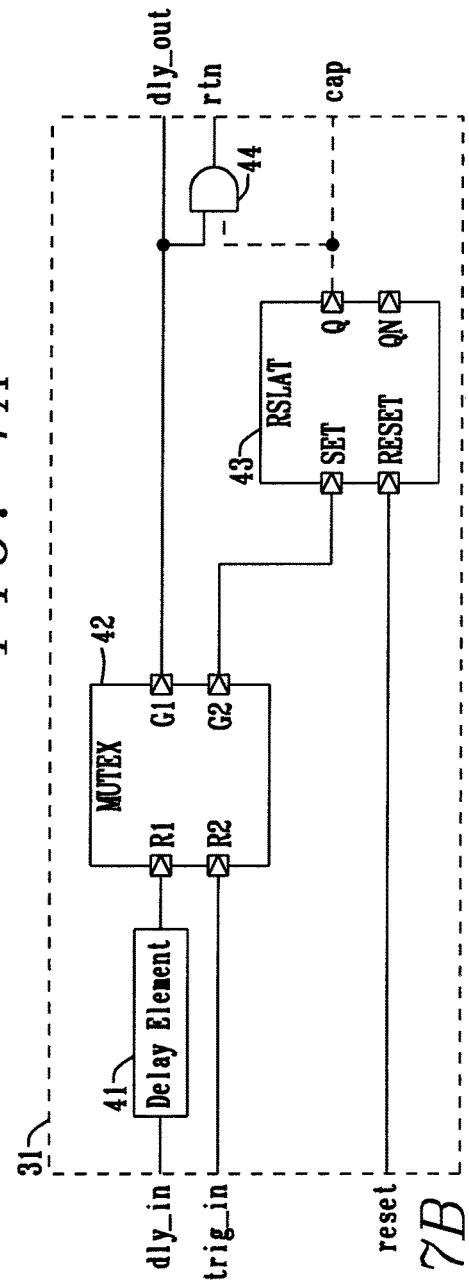
FIG. 7A
FIG. 7B

DIGITAL TIMER DELAY LINE WITH SUB-SAMPLE ACCURACY

TECHNICAL FIELD

The present document relates to digital timers. In particular, the present document relates to a digital timer delay line with sub-sample accuracy.

BACKGROUND

Many applications require accurate delay timers which are triggered by an asynchronous event and generate a response signal a specified amount of time after the trigger arrived. Common implementations can be based on analog or digital circuitry.

An analog implementation may involve e.g. charging a capacitance up to a certain threshold. Such a charging process may be started by a trigger event. An advantage of this analog implementation is that asynchronous triggering becomes possible, i.e. the system immediately responds and starts the time measurement independent of a clock cycle which is typically used in digital implementations. However, it is a disadvantage of analog implementations that is difficult to implement long and accurate timers. Increasing the accuracy of analogous timers typically requires a substantial amount of trimming to counteract disadvantageous process, voltage and temperature (PVT) variation effects.

Digital solutions are typically clock based and involve a digital counter. The digital timer is started by a synchronized trigger event. One technical advantage of digital implementations is that no additional trimming circuits may be required. Moreover, timers can be arbitrary long. However, digital timers suffer from an inherent timing error due to synchronization. The resulting error depends on the arrival time of the trigger signal and the maximum error equals the period of the clock signal used for sampling.

In some application scenarios, timers with high accuracy and with long absolute timer delays (>600 ns, +/−10 ns) are required to achieve the required performance figures. Furthermore, in some applications scenarios, the desired delay is defined as a fraction of a switching period of a power converter. This is difficult to achieve using legacy timer implementations.

SUMMARY

The present document addresses the above-mentioned technical problems. In particular, the present document addresses the technical problem of providing a digital, counter-based timer with a reduced delay error which is introduced by the discrete synchronization. In other words, it is an objective to remove the delay error when detecting a trigger signal. Such delay errors are inherent to systems where a trigger signal is sampled by a clocked (synchronous) system.

According to an aspect, a timer is presented which may comprise a first timer circuit configured to receive a clock signal and a trigger signal. The clock signal may be a periodic, binary signal which alternates between a logical high value (high phase) and a logical low value (low phase). The period of the clock signal may also be denoted as clock cycle of the clock signal. An edge of the trigger signal may arrive after a first edge of the clock signal and before a second edge of the clock signal. In general, all edges within this document may be rising or falling edges. The first and the second edge of the clock signal may be of the same type, i.e. the first and the second edge of the clock signal may be (a) both rising edges or may be (b) both falling edges.

The first timer circuit may be configured to determine, in a capture phase, a time offset interval for approximating a time interval between the first edge of the clock signal and the edge of the trigger signal. The first timer circuit may be configured to generate, at the end of a count phase, an edge of an internal response signal at the end of a predetermined time interval measured from the second edge of the clock signal. The first timer circuit may be configured to generate, at the end of a replay phase, an edge of a return signal at the end of the time offset interval measured from the edge of the internal response signal. Both the internal response signal and the return signal may represent aperiodic binary signal. A rising or falling edge of the return signal may indicate the expiry of the timer.

The predetermined time interval may equal a predetermined number of clock cycles of the clock signal. In particular, the first timer circuit may comprise a counter configured to generate, during the count phase, the edge of the internal response signal by counting—starting at the second edge of the clock signal—the predetermined number of clock cycles of the clock signal. As a result, the described timer expires approximately (N+1) clock cycles after the (asynchronous) arrival of the edge of the trigger signal, wherein N denotes the predetermined number of clock cycles of the clock signal. The resolution of the proposed timer is independent of the specific arrival time of the edge of the trigger signal and, thus, is independent of the period of the clock signal.

The first timer circuit may comprise a delay line circuit with a plurality of delay units connected in series. The delay line circuit may be configured to determine said time offset interval in the capture phase, and to generate said edge of the return signal at the end of the replay phase.

The timer may be configured to, in the capture phase, apply the clock signal to the delay line circuit such that the clock signal is successively delayed by the plurality of delay units. The timer may be configured to, in the capture phase, apply the trigger signal directly to each delay unit. The timer may be configured to, in the capture phase, determine the time offset interval by determining a particular one of the plurality of delay units where said edge of the trigger signal arrives before a delayed version of the clock signal.

The timer may be configured to, in the replay phase, apply the internal response signal to the delay line circuit such that the internal response signal is successively delayed by the plurality of delay units. The timer may be configured to, in the replay phase, generate the edge of the return signal when said edge of the delayed internal response signal reaches the particular one of the plurality of delay units. In this way, the offset time interval is reproduced immediately after the predetermined time interval to compensate for the time interval which has lapsed between the first edge of the clock signal and the edge of the trigger signal.

The first timer circuit may comprise a multiplexer configured to apply, in the capture phase, the clock signal to the delay line circuit. The multiplexer may be configured to apply, in the replay phase, the internal response signal to the delay line circuit. As an advantage, the multiplexer makes it possible to reuse the same delay line (i.e. the plurality of delay units) for reproducing an identical delay which has been measured during the capture phase. In addition, the number of circuit elements is reduced since only a single delay line is required, resulting in substantial circuit area savings.

Each delay unit may comprise a delay element coupled between a delay input of the delay unit and a delay output of the delay unit. The delay element may be configured to delay a signal arriving at the delay input by a delay time interval. For example, the delay time intervals of the different delay elements may be identical. Moreover, each delay unit may comprise an arbiter circuit coupled to an output of the delay element and to a trigger input of the delay unit. The arbiter circuit may be configured to determine the particular one of the plurality of delay units.

Furthermore, each delay unit may comprise a resettable memory element coupled between an output of the arbiter circuit and an output of the delay unit. In particular, the resettable memory element may be coupled to the output of the delay unit indicating that the trigger signal has arrived at the arbiter circuit before the delayed clock signal. The resettable memory element may be configured to store an internal state of the delay unit indicating that the trigger signal has arrived before the delayed version of the clock signal at the arbiter circuit of this delay unit. In other words, the resettable memory element may be configured to memorize the particular one of the plurality of delay units which has been determined by the corresponding arbiter circuit. For instance, the resettable memory element may be an RS latch. The resettable memory element may be configured to be reset after the edge of the return signal has been generated at the end of the replay phase.

The first timer circuit may comprise a signal extender circuit configured to extend either a high phase or a low phase of the received clock signal. The timer may further comprise a second timer circuit configured to generate a further return signal based on the clock signal and the trigger signal. The timer may comprise an inverter circuit configured to generate an inverted clock signal, wherein the inverted clock signal is an inverted version of the clock signal. Further, the timer may comprise an OR-gate for determining an overall return signal based on the return signal of the first timer circuit and the further return signal of the second timer circuit.

By using two different timer circuits with different polarities and overlap (as introduced e.g. by the signal extender circuit), potential detection problems during the capture phase are resolved e.g. when the edge of the trigger signal occurs close to the edge of the clock signal. For example, a correct measurement may only be possible if the edge of the trigger signal arrives during a high phase of the clock signal. Thus, using two different timer circuits with different polarities and overlap, a valid measurement may be guaranteed for all possible phase constellations between the edges of the trigger signal and the clock signal.

According to another aspect, a method of operating a timer is described. The method may comprise steps which correspond to the functional features of the timer described in the present document. Specifically, the method of operating a timer may be suitable for a timer comprising a first timer circuit for receiving a clock signal and a trigger signal, wherein an edge of the trigger signal may arrive after a first edge of the clock signal and before a second edge of the clock signal. The method may comprise determining, in a capture phase, by the first timer circuit, a time offset interval for approximating a time interval between the first edge of the clock signal and the edge of the trigger signal. The method may comprise generating, at the end of a count phase, by the first timer circuit, an edge of an internal response signal at the end of a predetermined time interval measured from the second edge of the clock signal. The method may comprise generating, at the end of a replay phase, by the first timer circuit, an edge of a return signal at the end of the time offset interval measured from the edge of the internal response signal.

The predetermined time interval may equal a predetermined number of clock cycles of the clock signal. The first timer circuit may comprise a counter. The method may comprise generating, during the count phase, by the counter, the edge of the internal response signal by counting—starting at the second edge of the clock signal—the predetermined number of clock cycles of the clock signal.

The first timer circuit may comprise a delay line circuit with a plurality of delay units connected in series. The method may comprise determining, by the delay line circuit, said time offset interval in the capture phase. The method may comprise generating, by the delay line circuit, said edge of the return signal at the end of the replay phase.

The method may comprise, in the capture phase, applying the clock signal to the delay line circuit such that the clock signal is successively delayed by the plurality of delay units. The method may comprise, in the capture phase, applying the trigger signal directly to each delay unit. The method may comprise, in the capture phase, determining the time offset interval by determining a particular one of the plurality of delay units where said edge of the trigger signal arrives before a delayed version of the clock signal.

The method may comprise, in the replay phase, applying the internal response signal to the delay line circuit such that the internal response signal is successively delayed by the plurality of delay units. The method may comprise, in the replay phase, generating the edge of the return signal when said edge of the delayed internal response signal reaches the particular one of the plurality of delay units.

The first timer circuit may comprise a multiplexer. The method may comprise applying, by the multiplexer, in the capture phase, the clock signal to the delay line circuit. The method may comprise applying, by the multiplexer, in the replay phase, the internal response signal to the delay line circuit.

Each delay unit may comprise a delay element coupled between a delay input of the delay unit and a delay output of the delay unit. Each delay unit may comprise an arbiter circuit coupled to an output of the delay element and to a trigger input of the delay unit. The method may comprise delaying, by the delay element, a signal arriving at the delay input by a delay time interval. The method may comprise determining, by the arbiter circuit, the particular one of the plurality of delay units.

Each delay unit may further comprise a resettable memory element coupled between an output of the arbiter circuit and an output of the delay unit. The first timer circuit may comprise a signal extender circuit for extending either a high phase or a low phase of the received clock signal. The timer may further comprise a second timer circuit for generating a further return signal based on the clock signal and the trigger signal. The timer may comprise an inverter circuit for generating an inverted clock signal, wherein the inverted clock signal is an inverted version of the clock signal. Finally, the timer may further comprise an OR-gate for determining an overall return signal based on the return signal of the first timer circuit and the further return signal of the second timer circuit.

According to a further aspect, a software program is described. The software program may be adapted for execution on a processor and for performing the method steps outlined in the present document when carried out by the processor.

According to another aspect, a storage medium is described. The storage medium may comprise a software program adapted for execution on a processor and for performing the method steps outlined in the present document when carried out by the processor.

According to a further aspect, a computer program product is described. The computer program product may comprise instructions for performing the method steps outlined in the present document when carried out by the processor.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The present invention is illustrated by way of example, and not by way of limitation, in the figures of the accompanying drawings in which like reference numerals refer to similar or identical elements, and in which

FIGS. 7A and 7B show signals within the proposed timer during a count phase;

DETAILED DESCRIPTION

Figure 1:
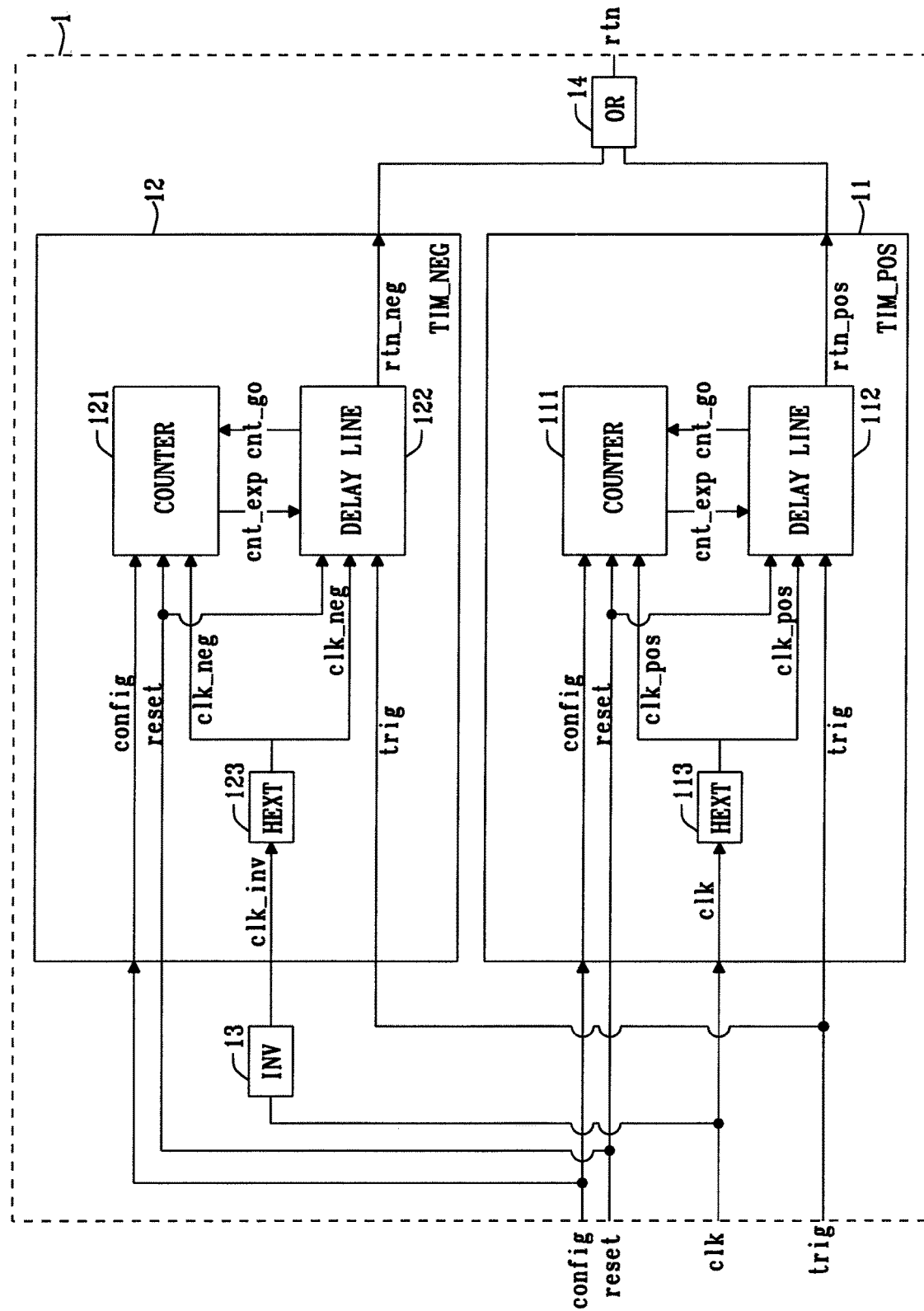
FIG. 1 shows an exemplary implementation of the proposed timer.

FIG. 1 shows an exemplary implementation of the proposed timer 1 comprising a first timer circuit 11 and a second timer circuit 12.

On the one hand, the first timer circuit 11 comprises a counter 111 for counting clock cycles of a clock signal. The first timer circuit 11 also comprises a delay line circuit 112 for both determining a time offset interval after the arrival of an edge of a trigger signal, and for reproducing the time offset interval after the counter 111 has finished counting a predetermined number of clock cycles of the clock signal. When the delay line circuit 112 has finished determining the time offset interval, the delay line circuit 112 generates an edge of signal cnt_go. When the counter 111 receives said edge of signal cnt_go, counter 111 will start counting the predetermined number of clock cycles at the next edge of the clock signal. When the counter 111 has finished counting the predetermined number of clock cycles of the clock signal, the counter 111 generates an edge of an internal response signal cnt_exp, which in turn instructs the delay line circuit 112 to reproduce the time offset interval. The first timer circuit 11 also comprises a signal extender circuit 113 for extending the high phase of the clock signal.

On the other hand, the second timer circuit 12 comprises a counter 121 for counting clock cycles of an inverted clock signal. The second timer circuit 12 also comprises a delay line circuit 122 for both determining the time offset interval and reproducing the time offset interval after the counter 121 has finished counting a predetermined number of clock cycles of the inverted clock signal. The timer 1 comprises an inverter 13 for generating the inverted clock signal clk_inv by inverting the clock signal clk. The second timer circuit 12 also comprises a signal extender circuit 123 for extending the high phase of the inverted clock signal clk_inv. In general, the functionality and signals within the second timer circuit 12 corresponds the functionality and signals within the first timer circuit 11. It should be mentioned that the delay of the inverter 13 shown should be less than the phase-extension of the signal extender circuit 123 in order to ensure usable overlap of the respective high-phases of clk_neg and clk_pos.

Finally, an OR-gate 14 determines the final return signal based on a first return signal rtn_pos generated by the first timer circuit 11 and a second return signal rtn_neg generated by the second timer circuit 12. Both counters 111 and 121 and both delay line circuits 112 and 122 may be reset by a reset signal. A configuration signal config may be used to adjust the predetermined number of clock cycles the counters 111 and 121 are supposed to count. In other words, the config signal is used to set the target of the synchronous counter and allows for configurable timer delay settings, wherein the step size equals 1 clock period of the clock signal.

Overall, the proposed implementation uses digital (counter based) timers but uses asynchronous circuitry (e.g. the delay line circuits 112 and 122) to improve the accuracy below the available clock period. The basic concept is the following. Firstly, the time offset interval is measured between a clock edge and a trigger by means of an asynchronous delay line. Secondly, after the trigger is captured, a counter starts counting M−1 clock cycles, wherein M denotes the required number of clock cycles to achieve the desired delay. If the counter expires, the internal response signal is generated. Thirdly, the return signal is further delayed by using the same delay line circuit which was used for determining the time offset interval to achieve an overall delay of exactly M clock cycles. In order to overcome the inherent setup/hold uncertainty when the trigger occurs close to clock edge, 2 timer instances 111 and 121 are used (utilizing clocks with opposite polarities and overlap) and the outputs of both timer instances 111 and 121 are combined.

A core innovation is the asynchronous delay line circuit capable of capturing and replaying the time offset interval between trigger and clock and its integration with the synchronous counter. In contrast to a purely synchronous timer, this scheme achieves a timer resolution that is independent of the clock period and corresponds to the delay of a single delay element of the delay line circuit (as will be described in the context of FIG. 3 below).

Moreover, the invention provides the following additional technical advantages. There is no additional trimming required, and the absolute accuracy depends only on the used oscillator. The delay scales automatically with the switching period of a power converter if the switching period is derived from the same oscillator. The In-System delay is configurable over a wide-range with minimal additional overhead. Compared to analog implementations, the proposed solution has an area advantage for medium/long timer delays. Further, the circuit allows to find an optimum tradeoff between area and resolution for a given clock period and technology by adjusting the number of delay elements used in every delay unit.

Figure 2:
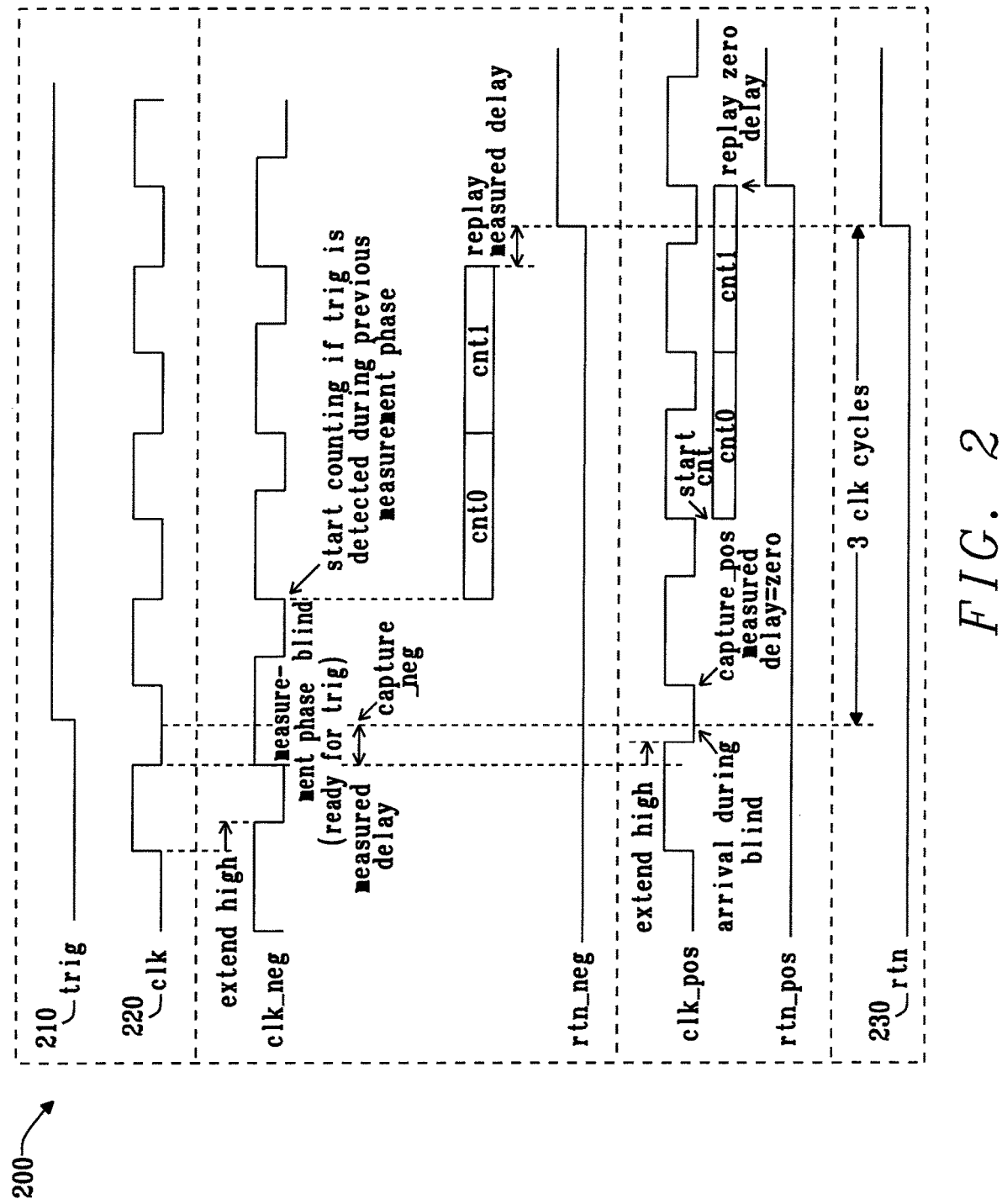
FIG. 2 shows an exemplary timing diagram of signals within the proposed timer.

FIG. 2 shows an exemplary timing diagram of signals 200, within the proposed timer 1. For instance, the general objective of the circuit may be to generate a rising edge on the return signal rtn 230 exactly t=M*clk_period after a rising edge of the trigger signal trig 210 entering the circuit. This needs to be independent of the phase/delay of the trigger signal trig relative to the clock signal clk 220. The diagram shows how the trigger signal trig enters both timer instances (tim_pos and tim_neg) and what happens in both of them. Upon arrival of the trigger signal trig, the second timer circuit 12 tim_neg is in measurement phase and ready to start a delay measurement while the first timer circuit 11 tim_pos is in blind phase. The clock signals for both instances are extended in such a way that the measurement phases overlap. By doing so, it is guaranteed that one of the two is always ready to accept a new incoming trigger signal trig. The return signals rtn at the outputs of both timer instances may be combined with a simple OR-gate 14. The circuit may expect the trigger signal trig to stay high after a rising edge at least until one of the delay units (see FIG. 3) sets the capture (cap) signal.

Figure 3:
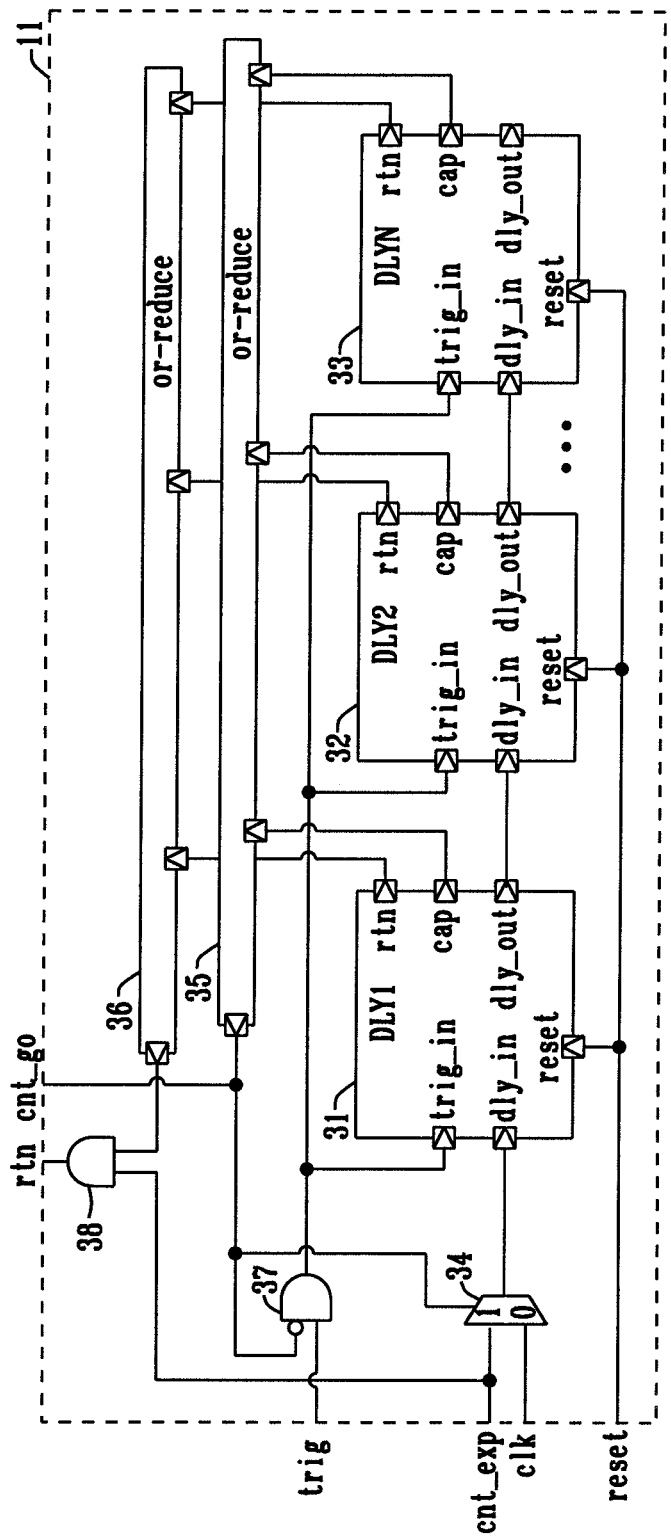
FIG. 3 shows an exemplary implementation of a delay line circuit.

FIG. 3 shows an exemplary implementation of a delay line circuit 11 (which may be identical to the delay line circuit 12). It comprises a plurality of delay units 31, 32, and 33 connected in series. Further, it comprises a multiplexer 34 configured to apply, in a capture phase, the clock signal to the delay units 31, 32, and 33, and to apply, in a replay phase, the internal response signal cnt_exp to the delay units 31, 32, and 33. Moreover, the delay line circuit 11 of FIG. 3 comprises an OR-gate 35 for generating the signal cnt_go based on the captures signals cap. Moreover, the delay line circuit 11 of FIG. 3 comprises an OR-gate 36 for generating an internal return signal based on the return signals rtn of the individual delay units 31, 32, and 33. Moreover, the delay line circuit 11 of FIG. 3 comprises AND-gates 37 for enabling/disabling the trigger signal provided to the delay units 31, 32, and 33. Moreover, the delay line circuit 11 of FIG. 3 comprises an AND-gate 38 for generating the return signal rtn based on the internal return signal and the internal response signal cnt_exp.

Figure 4:
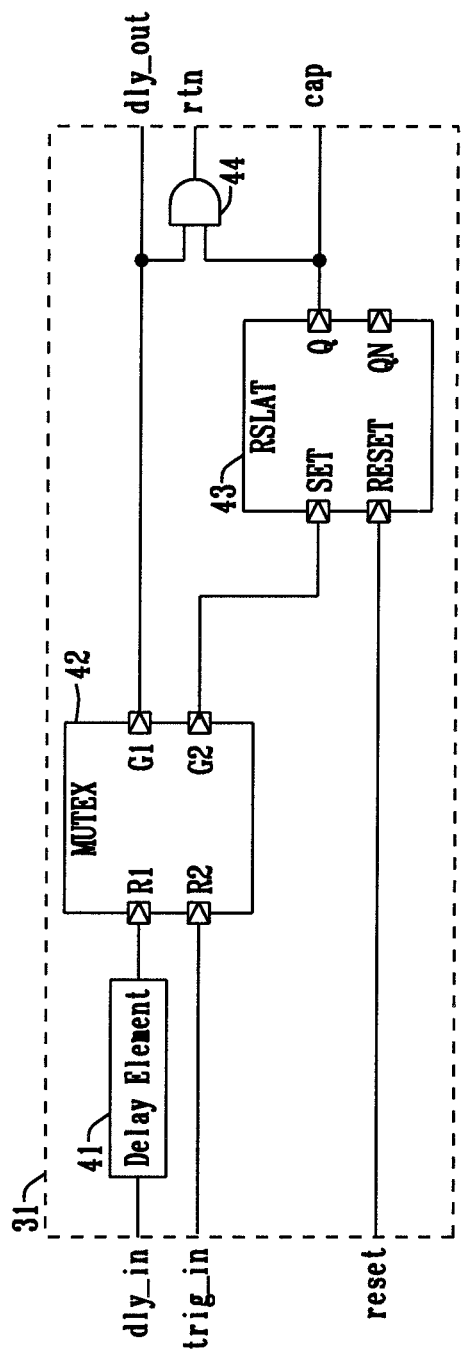
FIG. 4 shows an exemplary implementation of a delay unit.

FIG. 4 shows an exemplary implementation of a delay unit 31 (which may be identical to the delay units 32, 33, and further delay units not shown in FIG. 3). The delay unit 31 comprises a delay element 41 coupled between a delay input of the delay unit 31 and a delay output of the delay unit 31, wherein the delay element 41 delays a signal arriving at the delay input by a delay time interval. Delay element 41 may be implemented e.g. using a plurality of inverter circuits connected in series.

The delay unit 31 also comprises an arbiter circuit 42 coupled to an output of the delay element and to a trigger input of the delay unit 31, wherein the arbiter circuit 42 determines which of its two inputs arrives first. The arbiter circuit 42 has two request inputs R1 and R2 and two grant output G1 and G2. The arbiter circuit 42 may comprise e.g. an SR latch and a metastability filter. For instance, if the signal at the R1-input of arbiter circuit 42 arrives first, the G1-output will be set to logical 1 and the G2-output will be set to logical 0. This state is maintained (stored) independent of the signal at the R2-input of arbiter circuit 42. The other way around, if the signal at the R2-input of arbiter circuit 42 arrives first, the G2-output will be set to logical 1 and the G1-output will be set to logical 0. This state is again maintained (stored) independent of the signal at the R1-input of arbiter circuit 42.

In an alternative implementation, the delay element 41 may be arranged between the grant output G1 of the arbiter circuit 42 and the output of the delay unit 31. In this implementation, the arbiter circuit 42 may be configured to determine which of its two inputs arrives first, wherein one input corresponds to the trigger signal and the other input corresponds to the clock signal which has been delayed by the delay element 41 of the preceding delay unit 31.

The delay unit 31 further comprises resettable memory element 43 coupled between an output of the arbiter circuit 42 and a capture output of the delay unit 31. Delay unit 31 may further comprise an AND-gate 44 as illustrated in FIG. 4.

In the following FIGS. 5A to 9B, the operation of the proposed timer 1 is explained in an exemplary manner. At this, solid lines between the circuit elements represent signals which are logic 0, and dashed lines between the circuit elements represent signals which are logic 1.

Figure 5A:
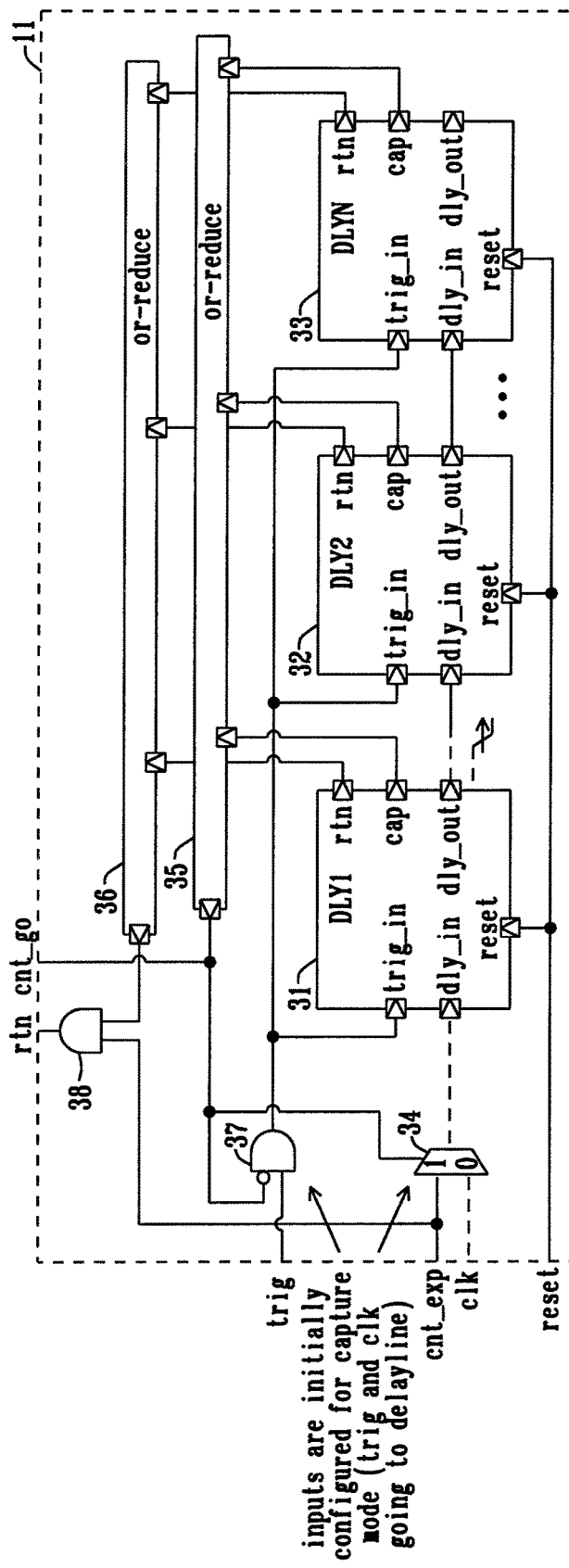
FIGS. 5A and 5B show signals within the proposed timer during a delay phase.
Figure 5B:
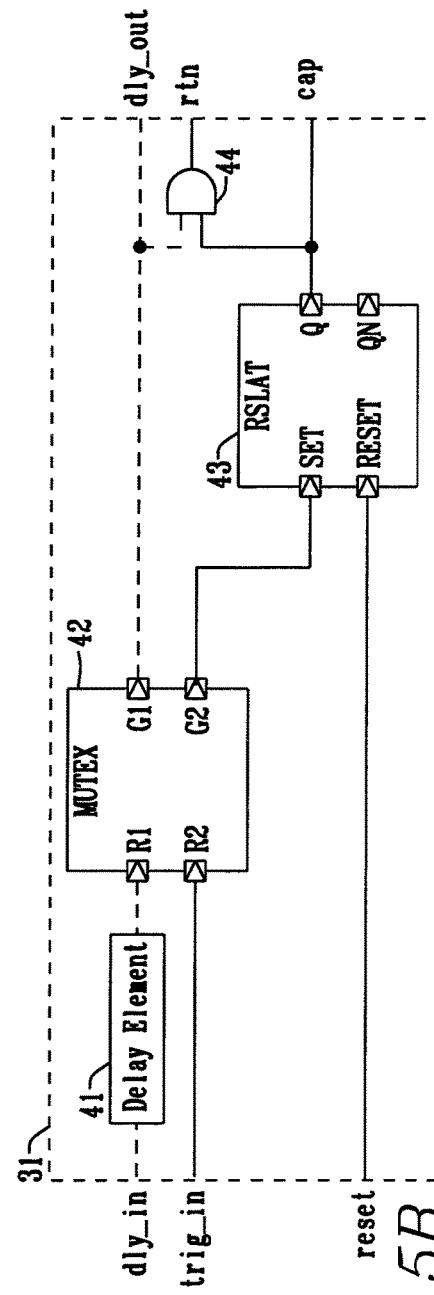

FIGS. 5A and 5B show signals within the proposed timer 1 during a delay phase. The inputs are configured for capture mode, The trigger signal trig and the clock signal clk are applied to the plurality of delay units 31, 32, and 33. The positive edge of the clock signal enters the circuit and propagates sequentially through the elements of the delay line.

Figure 6A:
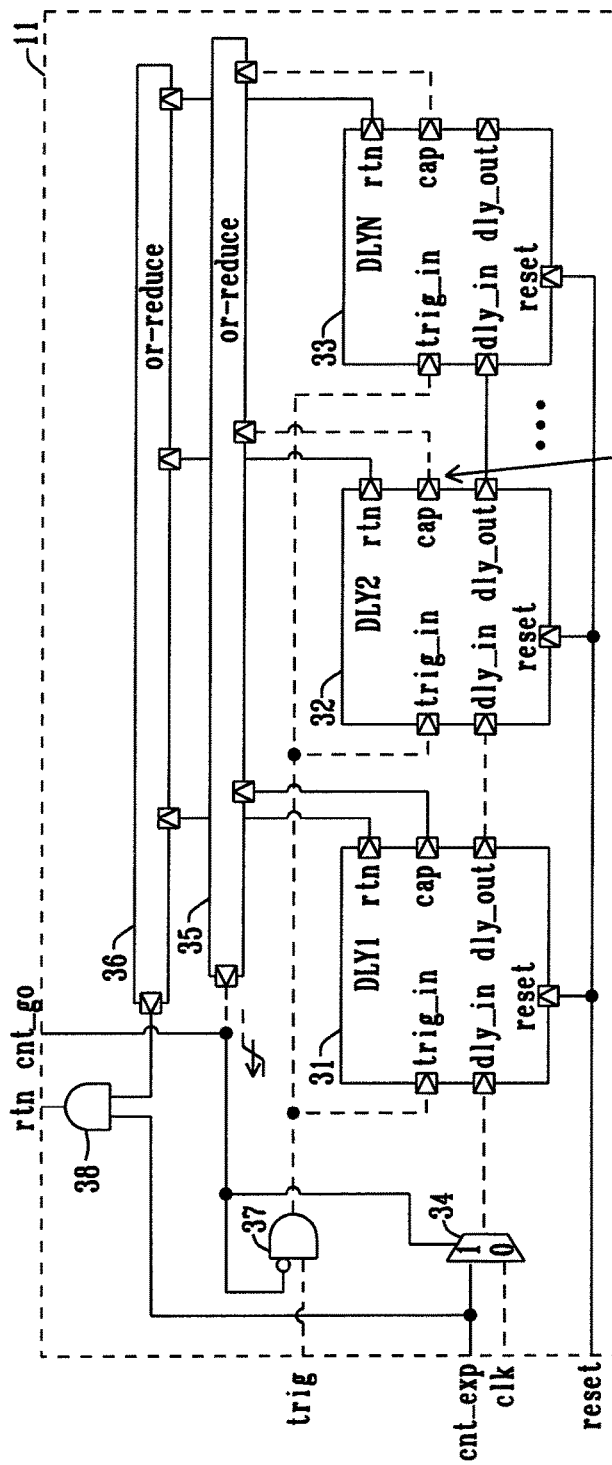
FIGS. 6A and 6B show signals within the proposed timer during a capture phase.
Figure 6B:
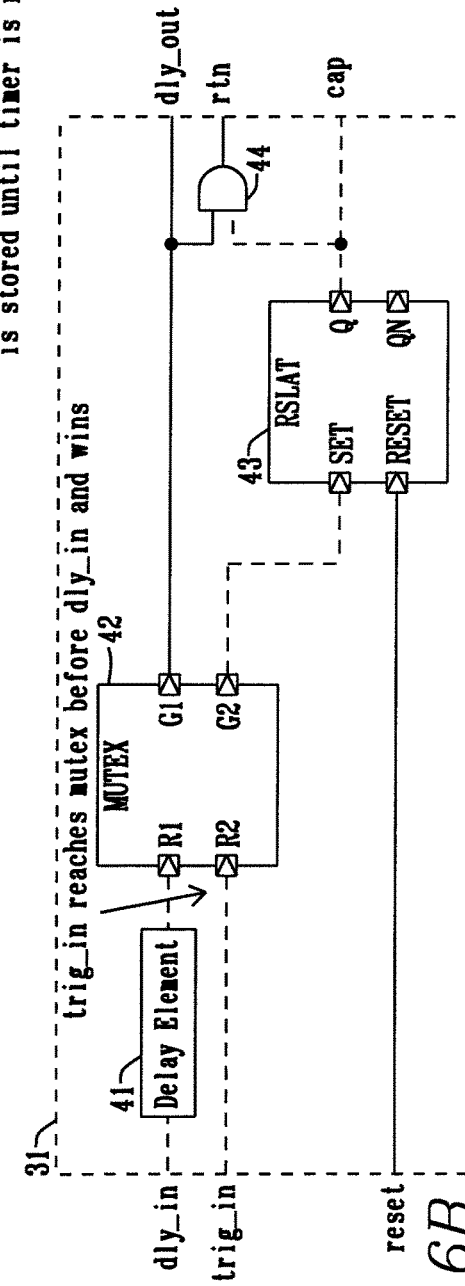

FIGS. 6A and 6B show signals within the proposed timer 1 during a capture phase. The positive edge of the trigger signal trig enters the circuit sometime after the positive edge of the clock signal clk. The delay elements, in which the trigger signal trig arrives before the clock signal clk has reached, set the internal cap signal to 1. The usage of arbiter circuits (Mutex) may ensure that G1 and G2 are never simultaneously set—even if the R1, R2 inputs change in close proximity. A potential decision delay (due to internal metastability resolution in the arbiter cell) will not deteriorate the delay measurement since then the next delay element will set cap=1 and the error is contained within the duration of a single delay element. This is latched until the circuit is reset again.

FIGS. 7A and 7B show signals within the proposed timer 1 during a count phase. As soon as the edge of the trigger signal is captured, the inputs are reconfigured to replay mode (cnt_go=1). The synchronous counter starts counting at the next positive edge of the clock signal clk. When the first delay element detects the edge of the trigger signal trig and sets its cap=1, this gates the trig signal and changes the input to the delay line from the clock signal clk to the cnt_exp signal.

Figure 8A:
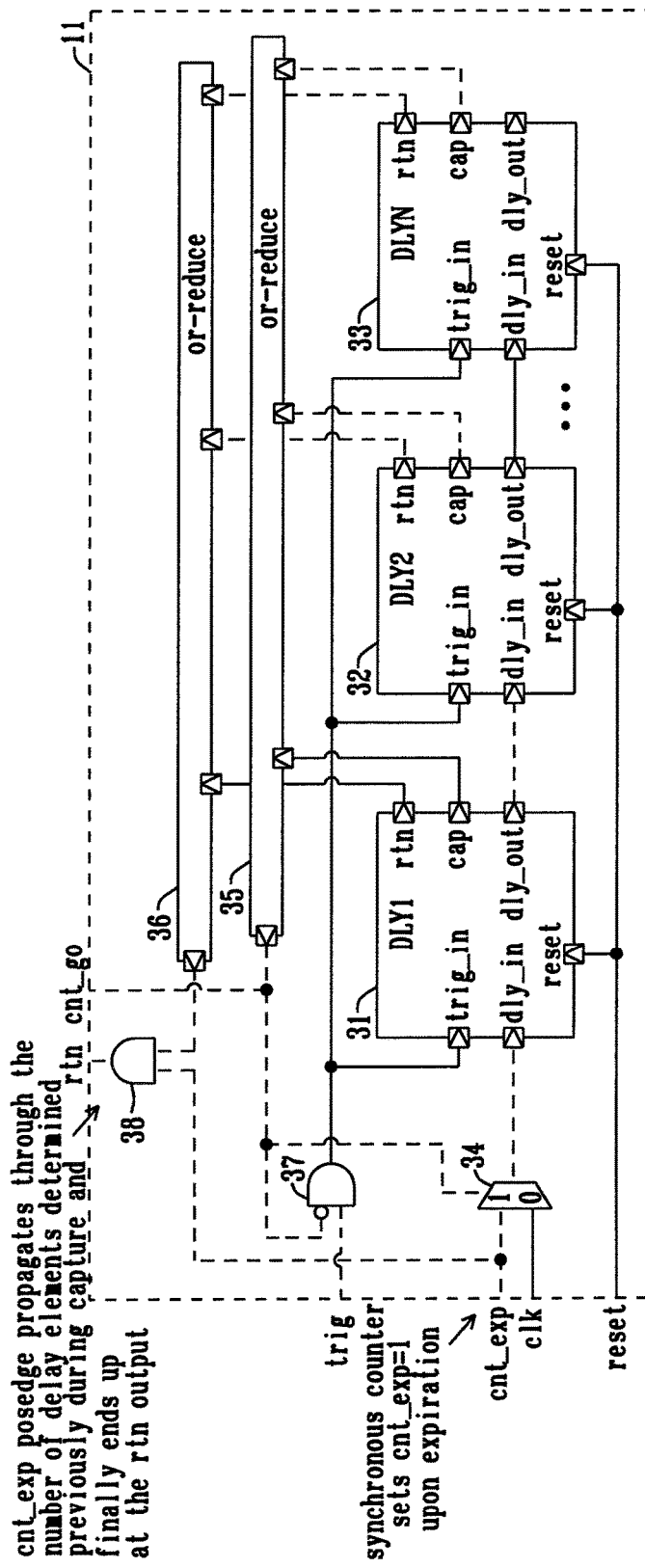
FIGS. 8A and 8B show signals within the proposed timer during a replay phase.
Figure 8B:
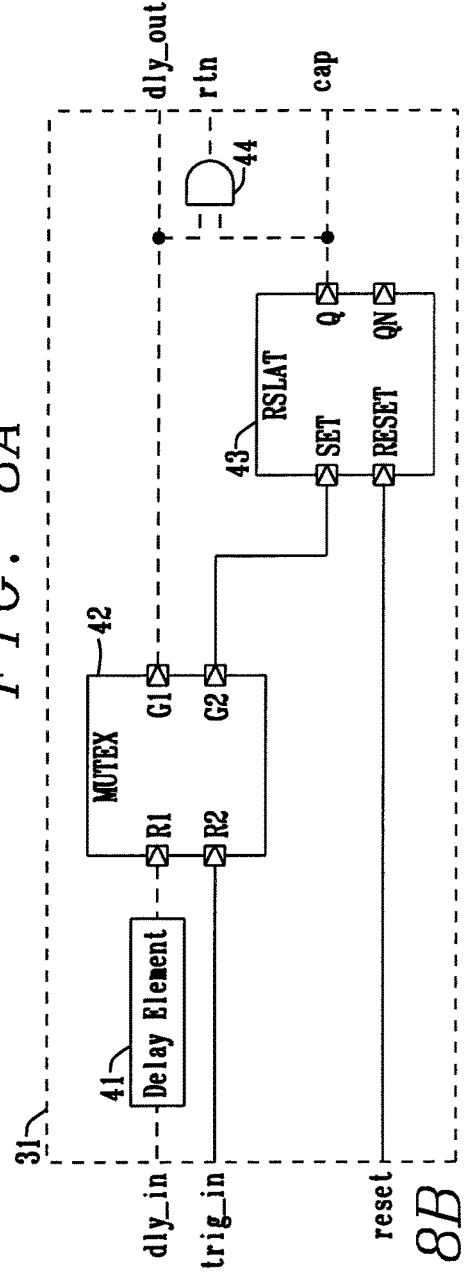

FIGS. 8A and 8B show signals within the proposed timer 1 during a replay phase. The synchronous counter sets cnt_exp to 1 upon expiration. The positive edge of the cnt_exp signal now propagates through the same number of delay elements determined previously during capture phase and finally triggers the return rtn output.

Figures 9A, 9B:
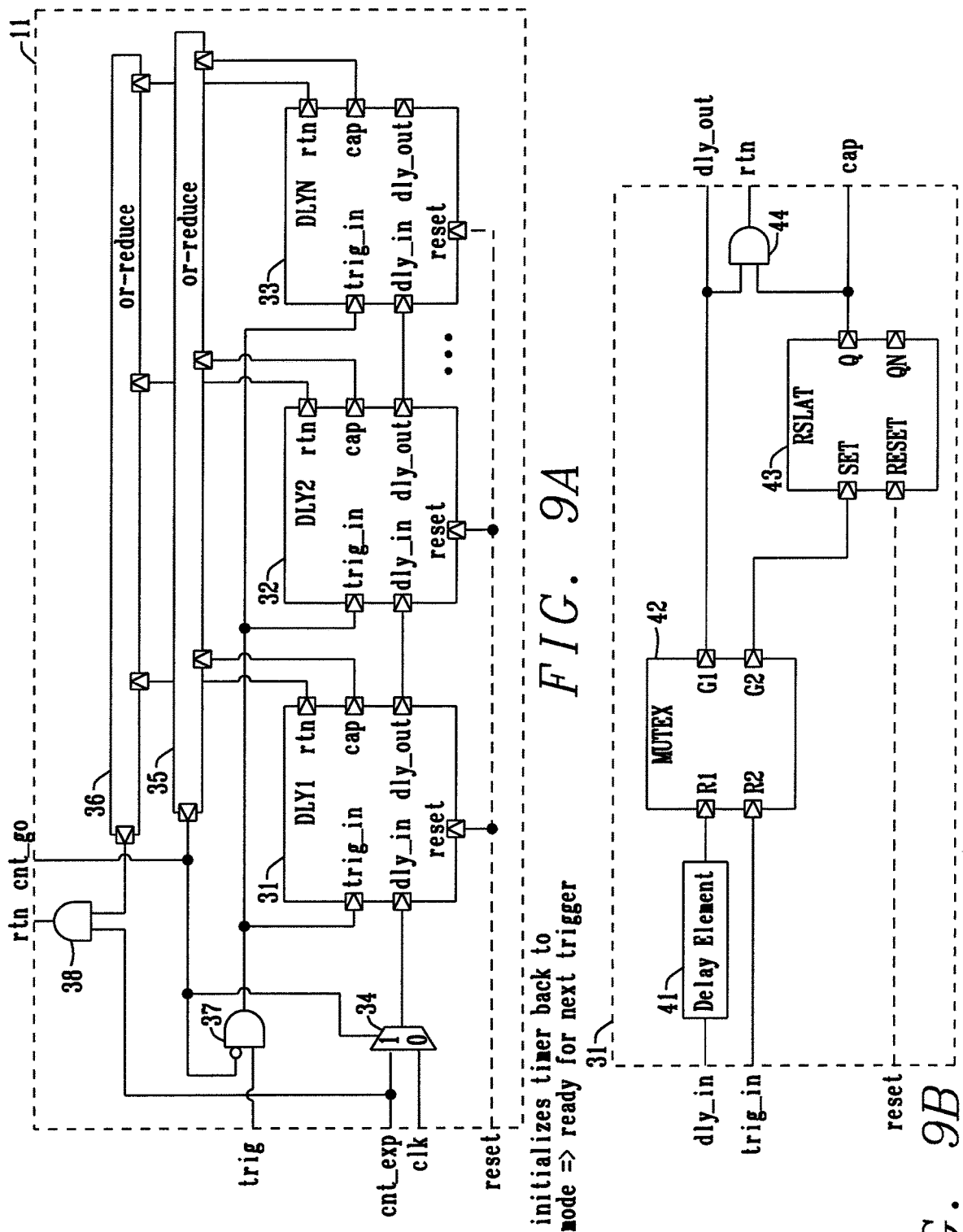
FIGS. 9A and 9B show signals within the proposed timer during a reset phase.

FIGS. 9A and 9B show signals within the proposed timer 1 during a reset phase. The input signal reset=1 initializes the circuit back to capture mode. The timer circuit is now ready to accept a new trigger event.

Figure 10:
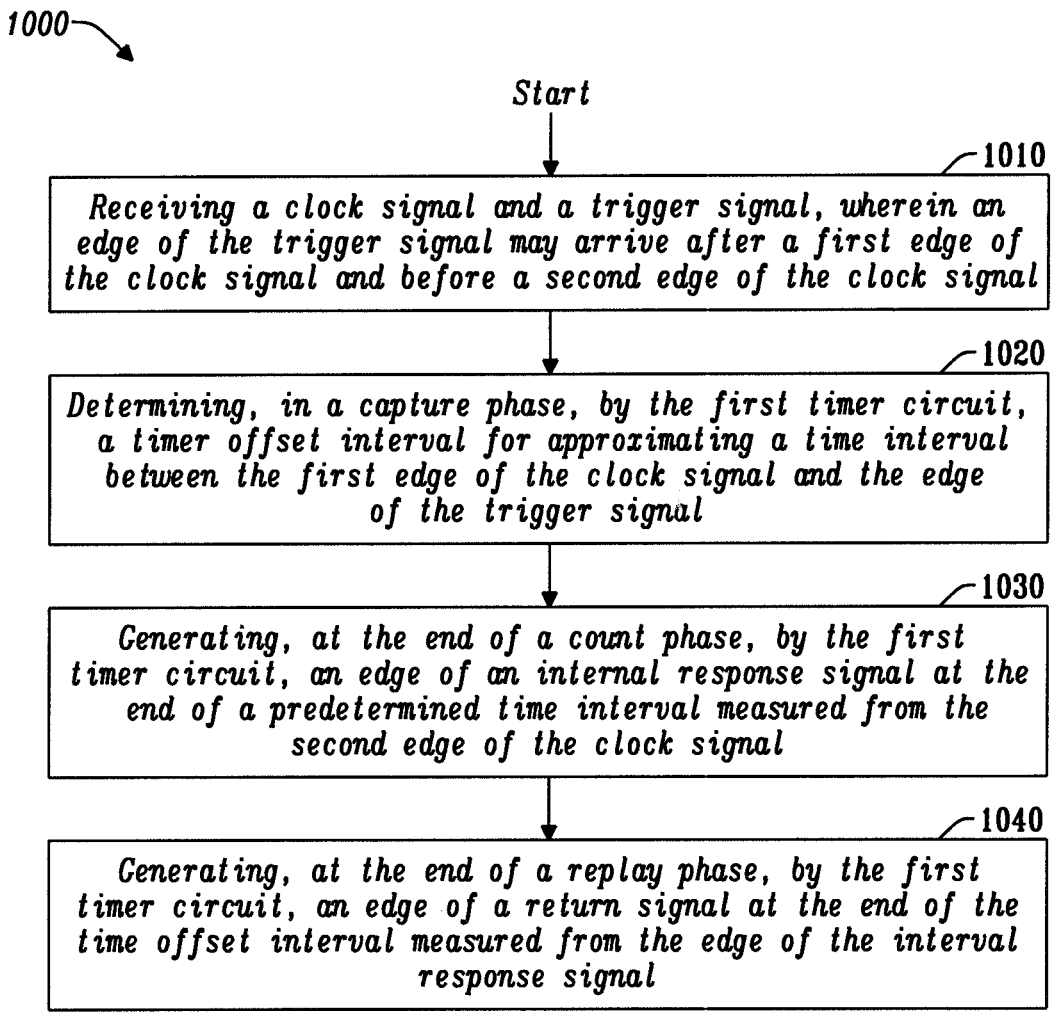
FIG. 10 shows a flowchart for a method for a digital timer delay line with sub-sample accuracy.

FIG. 10 shows a flowchart for a method 1000, for a digital timer delay line with sub-sample accuracy. The steps include 1010, receiving a clock signal and a trigger signal, wherein an edge of the trigger signal may arrive after a first edge of the clock signal and before a second edge of the clock signal. The steps also include 1020, determining, in a capture phase, by the first timer circuit, a time offset interval for approximating a time interval between the first edge of the clock signal and the edge of the trigger signal. The steps also include 1030, generating, at the end of a count phase, by the first timer circuit, an edge of an internal response signal at the end of a predetermined time interval measured from the second edge of the clock signal. The steps also include 1040, generating, at the end of a replay phase, by the first timer circuit, an edge of a return signal at the end of the time offset interval measured from the edge of the internal response signal.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A timer comprising a first timer circuit configured to receive a clock signal and a trigger signal, wherein an edge of the trigger signal arrives after a first edge of the clock signal and before a second edge of the clock signal, and wherein the first timer circuit is configured to
   determine, in a capture phase, a time offset interval for approximating a time interval between the first edge of the clock signal and the edge of the trigger signal,
   generate, at the end of a count phase, an edge of an internal response signal at the end of a predetermined time interval measured from the second edge of the clock signal, and
   generate, at the end of a replay phase, an edge of a return signal at the end of the time offset interval measured from the edge of the internal response signal.

2. The timer according to claim 1, wherein the predetermined time interval equals a predetermined number of clock cycles of the clock signal.

3. The timer according to claim 2, wherein the first timer circuit comprises a counter configured to
   generate, during the count phase, the edge of the internal response signal by counting, starting at the second edge of the clock signal, the predetermined number of clock cycles of the clock signal.

4. The timer according to claim 1, wherein the first timer circuit comprises a delay line circuit with a plurality of delay units connected in series, wherein the delay line circuit is configured to
   determine said time offset interval in the capture phase, and
   generate said edge of the return signal at the end of the replay phase.

5. The timer according to claim 4, wherein the timer is configured to, in the capture phase,
   apply the clock signal to the delay line circuit such that the clock signal is successively delayed by the plurality of delay units,
   apply the trigger signal directly to each delay unit, and
   determine the time offset interval by determining a particular one of the plurality of delay units where said edge of the trigger signal arrives before a delayed version of the clock signal.

6. The timer according to claim 5, wherein the timer is configured to, in the replay phase,
   apply the internal response signal to the delay line circuit such that the internal response signal is successively delayed by the plurality of delay units, and
   generate the edge of the return signal when said edge of the delayed internal response signal reaches the particular one of the plurality of delay units.

7. The timer according to claim 1, wherein the first timer circuit comprises a multiplexer configured to
   apply, in the capture phase, the clock signal to the delay line circuit, and to
   apply, in the replay phase, the internal response signal to the delay line circuit.

8. The timer according to claim 4, wherein each delay unit comprises
   a delay element coupled between a delay input of the delay unit and a delay output of the delay unit, wherein the delay element is configured to delay a signal arriving at the delay input by a delay time interval, and
   an arbiter circuit coupled to an output of the delay element and to a trigger input of the delay unit, wherein the arbiter circuit is configured to determine the particular one of the plurality of delay units.

9. The timer according to claim 8, wherein each delay unit further comprises
   a resettable memory element coupled between an output of the arbiter circuit and an output of the delay unit.

10. The timer according to claim 1, wherein the first timer circuit comprises a signal extender circuit configured to extend either a high phase or a low phase of the received clock signal.

11. The timer according to claim 1, further comprising a second timer circuit configured to generate a further return signal based on the clock signal and the trigger signal, wherein the timer further comprises an inverter circuit configured to generate an inverted clock signal, wherein the inverted clock signal is an inverted version of the clock signal.

12. The timer according to claim 11, further comprising an OR-gate for determining an overall return signal based on the return signal of the first timer circuit and the further return signal of the second timer circuit.

13. A method of operating a timer, wherein the timer comprises a first timer circuit for receiving a clock signal and a trigger signal, wherein an edge of the trigger signal arrives after a first edge of the clock signal and before a second edge of the clock signal, and wherein the method comprises:
   determining, in a capture phase, by the first timer circuit, a time offset interval for approximating a time interval between the first edge of the clock signal and the edge of the trigger signal,
   generating, at the end of a count phase, by the first timer circuit, an edge of an internal response signal at the end of a predetermined time interval measured from the second edge of the clock signal, and generating, at the end of a replay phase, by the first timer circuit, an edge of a return signal at the end of the time offset interval measured from the edge of the internal response signal.

14. The method according to claim 13, wherein the predetermined time interval equals a predetermined number of clock cycles of the clock signal.

15. The method according to claim 14, wherein the first timer circuit comprises a counter, and wherein the method comprises:
generating, during the count phase, by the counter, the edge of the internal response signal by counting, starting at the second edge of the clock signal, the predetermined number of clock cycles of the clock signal.

16. The method according to claim 13, wherein the first timer circuit comprises a delay line circuit with a plurality of delay units connected in series, wherein the method comprises:
determining, by the delay line circuit, said time offset interval in the capture phase, and
generating, by the delay line circuit, said edge of the return signal at the end of the replay phase.

17. The method according to claim 16, wherein the method comprises in the capture phase:
applying the clock signal to the delay line circuit such that the clock signal is successively delayed by the plurality of delay units,
applying the trigger signal directly to each delay unit, and
determining the time offset interval by determining a particular one of the plurality of delay units where said edge of the trigger signal arrives before a delayed version of the clock signal.

18. The method according to claim 17, wherein the method comprises in the replay phase:
applying the internal response signal to the delay line circuit such that the internal response signal is successively delayed by the plurality of delay units, and
generating the edge of the return signal when said edge of the delayed internal response signal reaches the particular one of the plurality of delay units.

19. The method according to claim 13, wherein the first timer circuit comprises a multiplexer, and wherein the method comprises:
applying, by the multiplexer, in the capture phase, the clock signal to the delay line circuit, and to
applying, by the multiplexer, in the replay phase, the internal response signal to the delay line circuit.

20. The method according to claim 16, wherein each delay unit comprises a delay element coupled between a delay input of the delay unit and a delay output of the delay unit, and wherein each delay unit comprises an arbiter circuit coupled to an output of the delay element and to a trigger input of the delay unit, wherein the method comprises:
delaying, by the delay element, a signal arriving at the delay input by a delay time interval, and
determining, by the arbiter circuit, the particular one of the plurality of delay units.

21. The method according to claim 20, wherein each delay unit further comprises
a resettable memory element coupled between an output of the arbiter circuit and an output of the delay unit.

22. The method according to claim 13, wherein the first timer circuit comprises a signal extender circuit for extending either a high phase or a low phase of the received clock signal.

23. The method according to claim 13, wherein the timer further comprises a second timer circuit for generating a further return signal based on the clock signal and the trigger signal, wherein the timer comprises an inverter circuit for generating an inverted clock signal, wherein the inverted clock signal is an inverted version of the clock signal.

24. The method according to claim 23, wherein the timer further comprises an OR-gate for determining an overall return signal based on the return signal of the first timer circuit and the further return signal of the second timer circuit.

* * * * *